(12) United States Patent
Tajima et al.

(10) Patent No.: US 8,238,133 B2
(45) Date of Patent: Aug. 7, 2012

(54) SEMICONDUCTOR DEVICE WITH A SELECTION CIRCUIT SELECTING A SPECIFIC PAD

(75) Inventors: Shingo Tajima, Tokyo (JP); Hiromasa Takeda, Tokyo (JP); Shotaro Kobayashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 248 days.

(21) Appl. No.: 12/801,151

(22) Filed: May 25, 2010

(65) Prior Publication Data

US 2011/0199803 A1 Aug. 18, 2011

(30) Foreign Application Priority Data

Feb. 18, 2010 (JP) .................................. 2010-033196

(51) Int. Cl.
*G11C 5/02* (2006.01)
(52) U.S. Cl. .............................. 365/51; 365/63; 365/193
(58) Field of Classification Search .................... 365/51, 365/63, 193
See application file for complete search history.

(56) References Cited

U.S. PATENT DOCUMENTS

| | | | |
|---|---|---|---|
| 6,501,689 B2 * | 12/2002 | Kuroda et al. | 365/200 |
| 7,391,113 B2 * | 6/2008 | Isa et al. | 257/737 |
| 2002/0181289 A1 * | 12/2002 | Matsubara et al. | 365/185.33 |
| 2007/0085214 A1 | 4/2007 | Isa et al. | |
| 2010/0091537 A1 * | 4/2010 | Best et al. | 365/51 |

FOREIGN PATENT DOCUMENTS

JP 2007-95911 A 4/2007

* cited by examiner

*Primary Examiner* — Tuan T. Nguyen
(74) *Attorney, Agent, or Firm* — McGinn IP Law Group, PLLC (57) ABSTRACT

A semiconductor device includes a selection circuit for selecting a specific pad of a semiconductor memory. The semiconductor device is configured to produce a signal determined by a pin array by the selection circuit.

17 Claims, 10 Drawing Sheets

| CHIP PAD NUMBER | x32 PRODUCT | x16 PRODUCT | x8 PRODUCT |
|---|---|---|---|
| 1 | – | – | – |
| 2 | – | – | – |
| 3 | VDD | VDD | VDD |
| 4 | VDD | VDD | VDD |
| 5 | VDD | VDD | VDD |
| 6 | VSSQ | – | – |
| 7 | DQ16 | – | – |
| 8 | DQ18 | – | – |
| 9 | VDDQ | – | – |
| 10 | DQ17 | – | – |
| 11 | DQ19 | – | – |
| 12 | VSSQ | – | – |
| 13 | DQS2B | – | – |
| 14 | DQS2 | – | – |
| 15 | VDDQ | – | – |
| 16 | DQ20 | – | – |
| 17 | DQ21 | – | – |
| 18 | VSSQ | – | – |
| 19 | DQ22 | – | – |
| 20 | DQ23 | – | – |
| 21 | VDDQ | – | – |
| 22 | DM2 | – | – |
| 23 | VSS | VSS | VSS |
| 24 | VSS | VSS | VSS |
| 25 | VDD | VDD | VDD |
| 26 | A9 | A9 | A9 |
| 27 | A5 | A12 | A12 |
| 28 | A12 | A7 | A7 |
| 29 | A3 | A5 | A5 |
| 30 | A10 | A3 | A3 |
| 31 | A1 | A1 | A1 |
| 32 | A7 | A10 | A10 |
| 33 | BA2 | BA0 | BA0 |
| 34 | BA1 | BA1 | BA1 |
| 35 | VDD | VDD | VDD |
| 36 | VDD | VDD | VDD |
| 37 | VF | VF | VF |
| 38 | WEB | BA2 | BA2 |
| 39 | BA0 | WEB | WEB |
| 40 | CKE | CKE | CKE |
| 41 | VREF | VREF | VREF |
| 42 | VSS | VSS | VSS |
| 43 | VSS | VSS | VSS |
| 44 | VSS | VSS | VSS |
| 45 | DM0 | NC | NC |
| 46 | VDDQ | VDDQ | VDDQ |
| 47 | DQ7 | DQ4 | DQ4 |
| 48 | DQ6 | DQ3 | DQ3 |
| 49 | VSSQ | VSSQ | VSSQ |
| 50 | DQ5 | DQ1 | DQ1 |
| 51 | DQ4 | LDM | DQ6 |
| 52 | VDDQ | VDDQ | VDDQ |
| 53 | DQS0 | DQ6 | RDQS |
| 54 | DQS0B | DQ12 | RDQSB |
| 55 | VSSQ | VSSQ | VSSQ |
| 56 | DQ3 | DQ11 | – |
| 57 | DQ1 | DQ9 | – |
| 58 | VDDQ | VDDQ | – |
| 59 | DQ2 | DQ14 | – |
| 60 | DQ0 | UDM | – |
| 61 | VSSQ | VSSQ | – |
| 62 | NC | VDDQ | – |
| 63 | VDD | VDD | VDD |
| 64 | VDD | VDD | VDD |
| 65 | VDD | VDD | VDD |
| 66 | – | – | – |
| 67 | – | – | – |

| CHIP PAD NUMBER | x32 PRODUCT | x16 PRODUCT | x8 PRODUCT |
|---|---|---|---|
| 68 | – | – | – |
| 69 | VSS | VSS | VSS |
| 70 | VSS | VSS | VSS |
| 71 | VSS | VSS | VSS |
| 72 | VSS | VSS | VSS |
| 73 | VSSQ | – | – |
| 74 | DQ24 | – | – |
| 75 | DQ26 | – | – |
| 76 | VDDQ | – | – |
| 77 | DQ25 | – | – |
| 78 | DQ27 | – | – |
| 79 | VSSQ | – | – |
| 80 | DQS3B | – | – |
| 81 | DQS3 | – | – |
| 82 | VDDQ | – | – |
| 83 | DQ28 | – | – |
| 84 | DQ29 | – | – |
| 85 | VSSQ | – | – |
| 86 | DQ30 | – | – |
| 87 | DQ31 | – | – |
| 88 | VDDQ | – | – |
| 89 | DM3 | – | – |
| 90 | – | – | – |
| 91 | A8 | NC | A13 |
| 92 | A4 | A11 | A11 |
| 93 | A11 | A8 | A8 |
| 94 | CS1 | A6 | A6 |
| 95 | A6 | A4 | A4 |
| 96 | CS0 | A0 | A0 |
| 97 | A0 | A2 | A2 |
| 98 | A2 | CSB | CSB |
| 99 | ODT | CASB | CASB |
| 100 | CASB | ODT | ODT |
| 101 | VSS | VSS | VSS |
| 102 | VSS | VSS | VSS |
| 103 | VDDL | VDDL | VDDL |
| 104 | RASB | RASB | RASB |
| 105 | VSSDL | VSSDL | VSSDL |
| 106 | CKB | CKB | CKB |
| 107 | CK | CK | CK |
| 108 | VDD | VDD | VDD |
| 109 | VDD | VDD | VDD |
| 110 | NC | VSSQ | VSSQ |
| 111 | DM1 | DQ2 | DQ2 |
| 112 | VDDQ | VDDQ | VDDQ |
| 113 | DQ15 | DQ5 | DQ5 |
| 114 | DQ14 | DQ0 | DQ0 |
| 115 | VSSQ | VSSQ | VSSQ |
| 116 | DQ13 | DQ7 | DQ7 |
| 117 | DQ12 | LDQS | DQS |
| 118 | VDDQ | VDDQ | VDDQ |
| 119 | DQS1 | LDQSB | DQSB |
| 120 | DQS1B | DQ13 | NC |
| 121 | VSSQ | VSSQ | VSSQ |
| 122 | DQ11 | DQ10 | – |
| 123 | DQ9 | DQ8 | – |
| 124 | VDDQ | VDDQ | – |
| 125 | DQ10 | DQ15 | – |
| 126 | DQ8 | UDQS | – |
| 127 | VSSQ | VSSQ | – |
| 128 | NC | UDQSB | – |
| 129 | VSS | VSS | VSS |
| 130 | VSS | VSS | VSS |
| 131 | VSS | VSS | VSS |
| 132 | VSS | VSS | VSS |
| 133 | – | – | – |

SEMICONDUCTOR DEVICE WITH A SELECTION CIRCUIT SELECTING A SPECIFIC PAD

This application is based upon and claims the benefit of priority from Japanese patent application No. 2010-033196, filed on Feb. 18, 2010, the disclosure of which is incorporated herein in its entirety by reference.

BACKGROUND OF THE INVENTION

1. Field of the Invention

This invention relates to a semiconductor device, and more particularly, to a package technique of a semiconductor chip.

2. Description of Related Art

At present, in semiconductor devices, high capacity and high speed are pursued and simultaneously a size of a package substrate is downsized. Dynamic random access memories (DRAMs) are used as high-performance memories in various uses such as a cellular telephone, a server, a personal computer (PC), or the like. Therefore, small species and high volume production are desired in the DRAMs. Accordingly, the DRAM chip which is operable, as one chip, at different data width of four, eight, sixteen, thirty-two, and so on is developed. Such a DRAM chip can be configured to perform data read ant write operations in one of 4-bit, 8-bit, 16-bit, and 32-bit units which will later be also described as a X4 product (a X4 device), a X8 product (a X8 device), a X16 product (a X16 device), and a X32 product (a X32 device), respectively. A general product is standardized by organization called Joint Electronic Device Engineering Council (JEDEC). In this spec, a pin configuration of the package substrate, pin signal assignment, and so on are defined in accordance with the DRAM chip and the data width thereof.

JP-A-2007-95911 (which corresponds to US Patent Application Publication No. US 2007/0085214 A1) discloses a semiconductor device having a semiconductor chip which is usable as any one of 4-bit, 8-bit, and 16-bit structure devices (X4, X8, and X16 products), and a package substrate for packaging the semiconductor chip. The semiconductor chip has first and second DQ pad groups of DQ system pads for the 16-bit structure device (the X16 product). The first DQ pad group is arranged in a first area at a vicinity of a middle part of a surface of the semiconductor chip while the second DQ pad group is arranged in a second are at an outer side of the first area on the surface. An additional pad necessary as one of DQ system pads for the 8-bit structure device (the X8 product) except for pads included in the second DQ pad group is formed in the second area. The additional pad is used on operating the semiconductor device as the 4-bit structure device (the X4 product) or the 8-bit structure device (the X8 product). That is, by adding the additional pad, JP-A-2007-95911 obtains the semiconductor device which is configured to perform data read and write operations in one of 4-bit, 8-bit, and 16-bit units. The semiconductor device disclosed in JP-A-2007-95911 is based on the premise that it is used as a SDRAM chip of a DDR3 type and JP-A-2007-95911 neither describes a SDRAM chip of a DDR2 type. Inasmuch as the pin configuration of the package substrate and the pin signal assignment are absolutely different between the SDRAM chip of the DDR2 type and the SDRAM chip of the DDR3 type, consideration different from that in the SDRAM chip of the DDR3 type is required in the SDRAM chip of the DDR2 type.

In the manner which is described above, the pin configuration and the pin signal assignment are different caused by the semiconductor memory chips and types of data widths thereof. In addition, in order to configure different bit configuration products at the same chip, a chip size is increased because exclusive chip pads are required.

SUMMARY

The present invention seeks to solve one or more of the above problems, or to improve upon those problems at least in part.

In one embodiment, there is provided a device that comprises a semiconductor memory chip configured to perform data read and write operations in one of 8-bit, 16-bit and 32-bit units, and a package substrate on which the semiconductor memory is mounted. The package substrate includes a plurality of pins. The semiconductor memory chip comprises at least two rows of chip pads, each of the rows including a plurality of chip pads electrically connected to the pins of the package substrate, respectively, a first circuit producing a read data strobe signal, a second circuit producing a data signal, and a selection circuit provided among one of the chip pads, the first circuit and the second circuit. The selection circuit electrically connects the one of the chip pads to the first circuit when the semiconductor chip is configured to perform the data read and write operations in 8-bit unit and to the second circuit when the second memory chip is configured to perform the data read and write operations in 16-bit unit.

In another embodiment, there is provided a device that comprises a SDRAM chip of a DDR2 type. The SDRAM chip comprises a plurality of chip pads, and a control circuit assigning one of the chip pads to a first signal when the SDRAM chip performs data read and write operations in 8-bit unit, to a second signal different from the first signal when the SDRAM chip performs data read and write operations in 16-bit unit and to a third signal different from each of the first and second signals when the SDRAM chip performs data read and write operations in 32-bit unit.

In still another embodiment, there is provided a device that comprises a SDRAM chip of a DDR2 type which may be configured to perform data read and write operations in one of the 8-bit, 16-bit and 32-bit unit, and a package substrate including a plurality of electrode pins. The SDRAM chip is mounted on the package substrate. The SDRAM chip comprises a plurality of electrode pads each electrically connected to an associated one of the electrode pins of the package substrate, a first circuit producing a read data strobe signal when the SDRAM chip is configured to perform the date read and write operations in 8-bit unit, a second circuit producing a data signal when the SDRAM chip is configured to perform the data read and write operations in 16-bit unit, a third circuit producing a data strobe signal when the SDRAM chip is configured to perform the data read and write operations in 32-bit unit, and a control circuit forming a first electrical path between one of the electrode pads and the first circuit when the SDRAM chip is configured to perform the data read and write operations in 8-bit unit, a second electrical path between the one of the electrode pads and the second circuit when the SDRAM chip is configured to perform the date read and write operations in 16-bit unit, and a third electrical path between the one of the electrode pads and the third circuit when the SDRAM chip is configured to perform the data read and write operations in 32-bit unit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device according to an exemplary embodiment of this invention comprises a semiconductor memory chip (not shown) configured to perform data read and write operations in one of 8-bit, 16-bit and 32-bit units (operable as any one of a X8 product, a X16 product, and a X32 product) and a package substrate 100 on which the semiconductor chip is mounted. The package substrate 100 includes a plurality of pins 110. Herein, it will be assumed that the semiconductor memory chip comprises a SDRAM chip of a DDR2 type.

In order to facilitate an understanding of this invention, the description will now be made about the package substrate 100 for the SDRAM chip of the DDR2 type.

Figure 1:
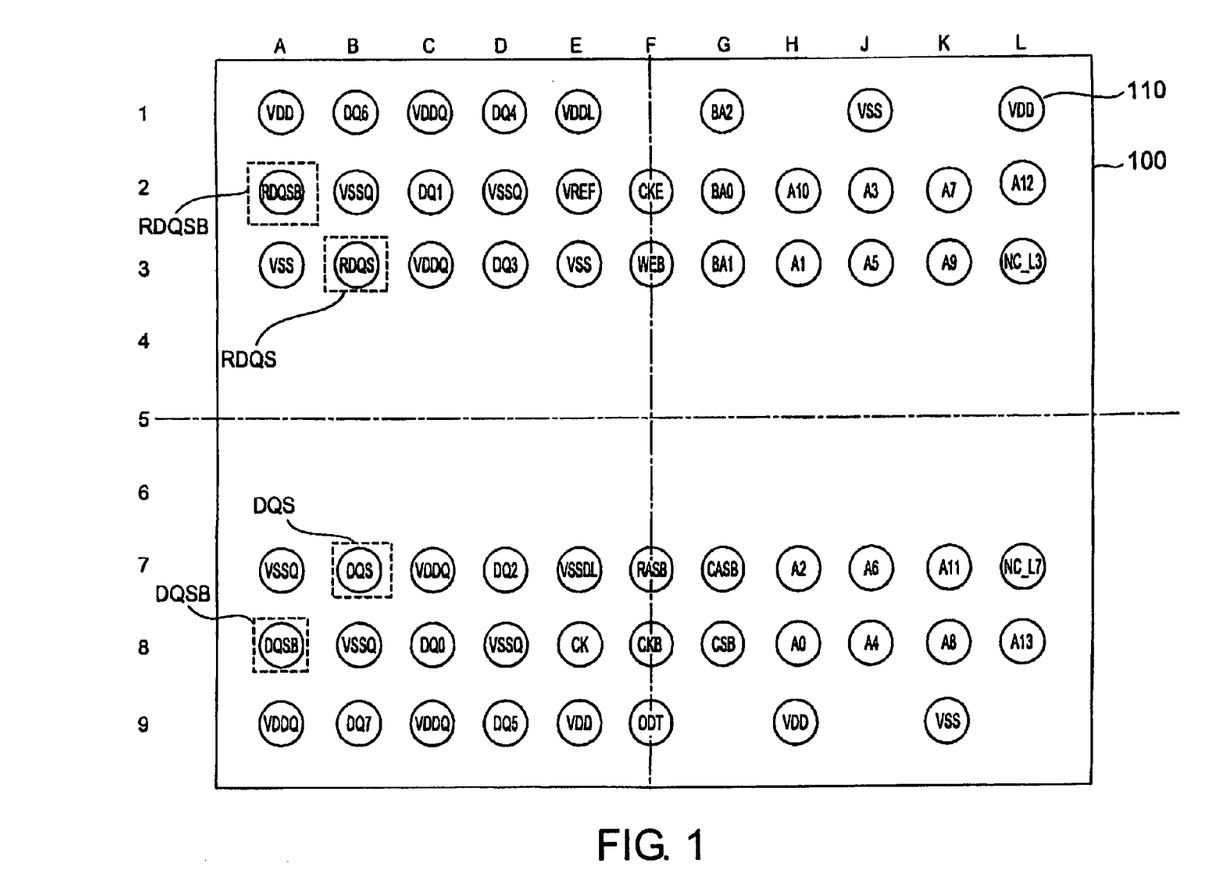
FIG. 1 is a view showing a pin configuration of a package substrate of a X8 product in a SDRAM chip of a DDR2 type standardized by JEDEC.
Figure 2:
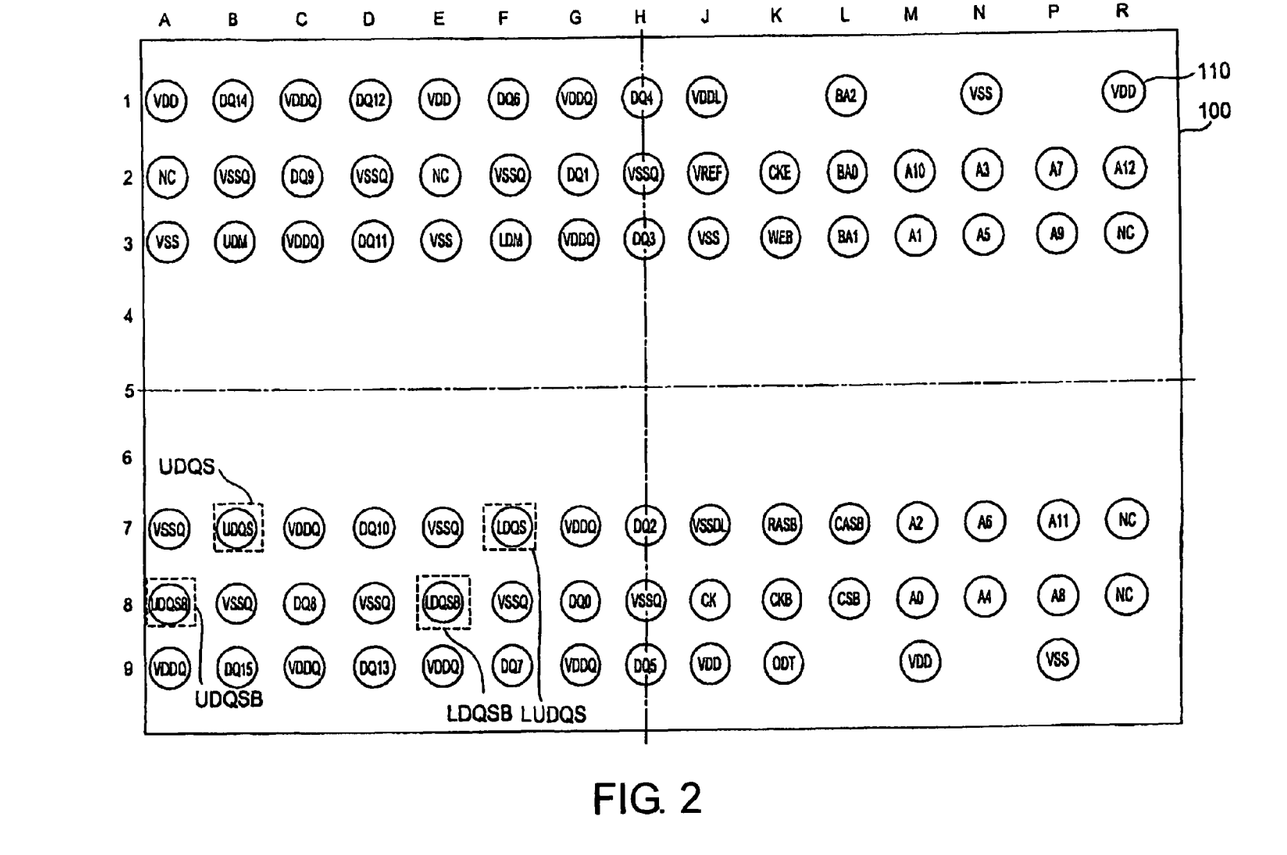
FIG. 2 is a view showing a pin configuration of a package substrate of a X16 product in a SDRAM chip of a DDR2 type standardized by JEDEC.
Figure 3:
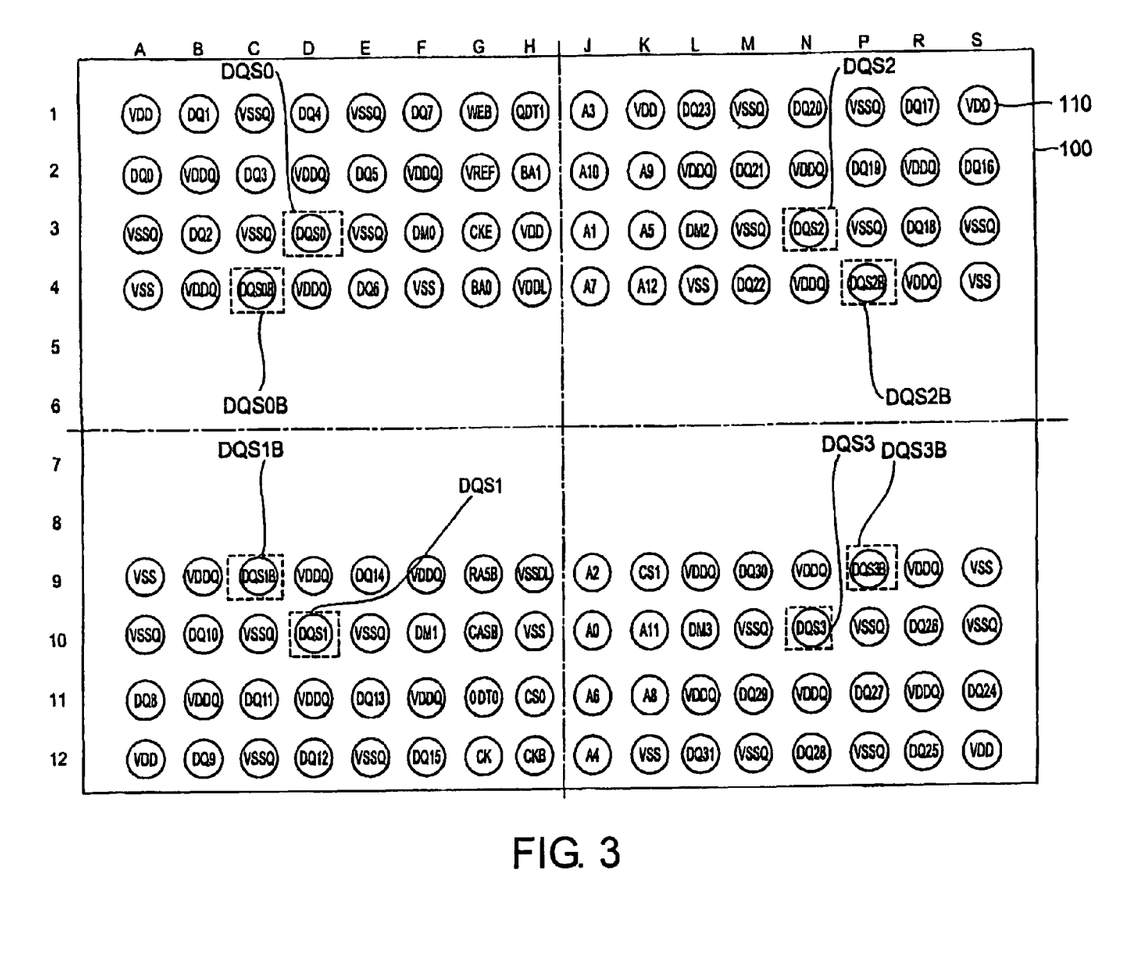
FIG. 3 is a view showing a pin configuration of a package substrate of a X32 product in a SDRAM chip of a DDR2 type standardized by JEDEC.

FIGS. 1, 2, and 3 show pin configurations of the package substrate 100 of the X8 product, the X16 product, and the X32 product in the SDRAM chip of the DDR2 type standardized by JEDEC, respectively. Configurations and signals of the pins 110 of the package substrate 100 are defined by JEDEC. The pins 110 shown in FIGS. 1 to 3 transmit and/or receive signals depicted at the pins 110. Now, the description will be made about a signal transmitted/received from/to each of the pins 110. Signals in which each A is attached to the beginning are a group of address signals. Signals in which each BA is attached to the beginning are a group of bank address signals. Signals in which each DQ is attached to the beginning are a group of data signals. A signal to which RASB is attached is a row address strobe signal. A signal to which CASB is attached is a column address strobe signal. Signals to which DQS, UDQ, and LDQS are attached are a group of data strobe signals. Signals to which DQSB, UDQB, and LDQSB are attached are a group of inverted data strobe signals. A signal to which RDQS is attached is a read data strobe signal. A signal to which RDQSB is attached is an inverted read data strobe signal. A signal to which CS is attached is a chip select signal. A signal to which CSB is attached is an inverted chip select signal. A signal to which CKE is attached is a clock enable signal. A signal to which CK is attached is a clock signal. A signal to which CKB is attached is an inverted clock signal. A signal to which VDD is attached is a power supply signal of an internal circuit. A signal to which VSS is attached is a ground signal of the internal circuit. A signal to which VDDQ is attached is a power supply signal of a data circuit. A signal to which VSSQ is attached is a ground signal of the data circuit. A signal to which VDDL is attached is a power supply signal of a DDL circuit. A signal to which VSSL is attached is a ground signal of the DLL circuit. A signal to which VREF is attached is a reference voltage signal. Signals to each of which DM is attached are a group of data mask signals. A signal to which WEB is attached is a write enable signal. A signal to which ODT is attached is an on die termination signal.

That is, the group of address signals, the group of bank address signals, the group of data signals, the row address strobe signal, the column address strobe signal, the group of data strobe signals, the grope of inverted data strobe signal, the read data strobe signal, the inverted read data strobe signal, the chip select signal, the inverted chip select signal, the clock enable signal, the clock signal, the inverted clock signal, the power supply signal of the internal circuit, the ground signal of the internal circuit, the power supply signal of the data circuit, the ground signal of the data circuit, the power supply signal of the DLL circuit, the ground signal of the DDL circuit, the reference voltage signal, the group of the data mask signal, the write enable signal, and the on die termination signal are signals having functions which are different from one another.

Now, the description will be concretely made about a pin configuration of the package substrate of the X8 product, the X-16 product, and the X32 product in the SDRAM chip of the DDR2 type.

As shown in FIG. 1, the package substrate 100 of the X8 product in the SDRAM chip of the DDR2 type comprises sixty pins 110. Inasmuch as the package substrate 100 of the X8 product has an 8-bit data width, the package substrate 100 of the X8 product comprises eight data signals DQ0 to DQ7, a pair of data strobe signals (DQS, DQSB), and a pair of read data strobe signals (RDQS, RDQSB). The package substrate 100 of the X8 product is classified into segment areas which are indicated by A to L in a transversal direction and are indicated by 1 to 9 in a longitudinal direction. The package substrate 100 of the X8 product is divided, by center lines of the package substrate 100 indicated by alternate long and short dashed lines in longitudinal and transversal directions, into four blocks, namely, an upper left block (1-5, A-F), an upper right block (1-5, F-L), a lower left block (5-9, A-F), and a lower right block (5-9, F-L). The pair of data strobe signals (DQS, DQSB) is disposed in the lower left block while the pair of read data strobe signals (RDQS, RDQSB) is disposed in the upper left block.

As shown in FIG. 2, the package substrate 100 of the X16 product in the SDRAM chip of the DDR2 type comprises eighty-four pins 110. Inasmuch as the package substrate 100 of the X16 product has a 16-bit data width, the package substrate 100 of the X16 product comprises sixteen data signals DQ0 to DQ15 and two pairs of data strobe signals (LDQS, LDQSB) and (UDQS, UDQSB). The package substrate 100 of the X16 product is classified into segment areas which are indicated by A to R in a transversal direction and are indicated by 1 to 9 in a longitudinal direction. The package substrate 100 of the X16 product is divided, by center lines of the package substrate 100 indicated by alternate long and short dashed lines in longitudinal and transversal directions, into four blocks, namely, an upper left block (1-5, A-H), an upper right block (1-5, H-R), a lower left block (5-9, A-H), and a lower right block (5-9, H-R). The two pairs of data strobe signals (LDQS, LDQSB) and (UDQS, UDQSB) are disposed in the lower left block.

As shown in FIG. 3, the package substrate 100 of the X32 product in the SDRAM chip of the DDR2 type comprises one hundred and twenty-eight pins 110. Inasmuch as the package substrate 100 of the X32 product has a 32-bit data width, the package substrate 100 of the X32 product comprises thirty-two data signals DQ0 to DQ31 and four pairs of data strobe signals (DQS0, DQS0B), (DQS1, DQS1B), (DQS2, DQS2B), and (DQS3, DQS3B). The package substrate 100 of the X32 product is classified into segment areas which are indicated by A to S in a transversal direction and are indicated by 1 to 12 in a longitudinal direction. The package substrate 100 of the X32 product is divided, by center lines of the package substrate 100 indicated by alternate long and short dashed lines in longitudinal and transversal directions, into four blocks, namely, an upper left block (1-6, A-H), an upper right block (1-6, J-S), a lower left block (7-12, A-H), and a lower right block (7-12, J-S). A first pair of data strobe signals (DQS0, DQS0B) is disposed in the upper left block, a second pair of data strobe signals (DQS1, DQS1B) is disposed in the lower left block, a third pair of data strobe signals (DQS2, DQS2B) is disposed in the upper right block, and a fourth pair of data strobe signals (DQS3, DQS3B) is disposed in the lower right block.

In the manner which is described above, the package substrate 100 of the X8 product comprises the pair of read data strobe signals (RDQS, RDQSB) which is not included in any of the package substrate 100 of the X16 product and the package 100 of the X32 product. The pair of read data strobe signals (RDQS, RDQSB) is signals for read data strobe signals. In the package substrate 100 of the X8 product, when the data signals (DQ0 to DQ7) are read out of the SDRAM chip of the DDR2 type, or when the SDRAM chip of the DDR2 type sends the data signals to a memory chip controller, the pair of read data strobe signals (RDQS, RDQSB) is activated. When the data signals are written in the SDRAM chip of the DDR2 type, the pair of read data strobe signals (RDQS, RDQSB) is not activated.

On the other hand, the pair of data strobe signals (DQS, DQSB) in the package substrate 100 of the X8 product, the two pairs of data strobe signals (LDQS, LDQSB) and (UDQS, UDQSB) in the package substrate 100 of X16 product, and the four pairs of data strobe signals (DQS0, DQS0B), (DQS1, DQS1B), (DQS2, DQS2B), and (DQS3, DQS3B) are signals for data strove signals. These data strobe signals are activated on both of reading-out and writing-in of the SDRAM chip of the DDR2 type.

Specifically speaking, the pair of data strobe signals (DQS, DQSB) in the package substrate 100 of the X8 product is activated on reading-out and writing-in of the eight data signals (DQ0 to DQ7). The two pairs of data strobe signals (LDQS, LDQSB) and (UDQS, UDQSB) in the package substrate 100 of the X16 product are activated on reading-out and writing-in of eight data signals (DQ0 to DQ7) and of eight data signals (DQ8 to DQ15), respectively. In the package substrate 100 of the X32 product, the first pair of data strobe signals (DQS0, DQS0B), the second pair of data strobe signals (DQS1, DQS1B), the third pair of data strobe signals (DQS2, DQS2B), and the fourth pair of data strobe signals (DQS3, DQS3B) are activated on reading-out and writing-in of eight data signals DQ0 to DQ7, eight data signals DQ8 to DQ15, eight data signals DQ16 to DQ23, and eight data signals DQ24 to DQ31, respectively.

Figure 4:
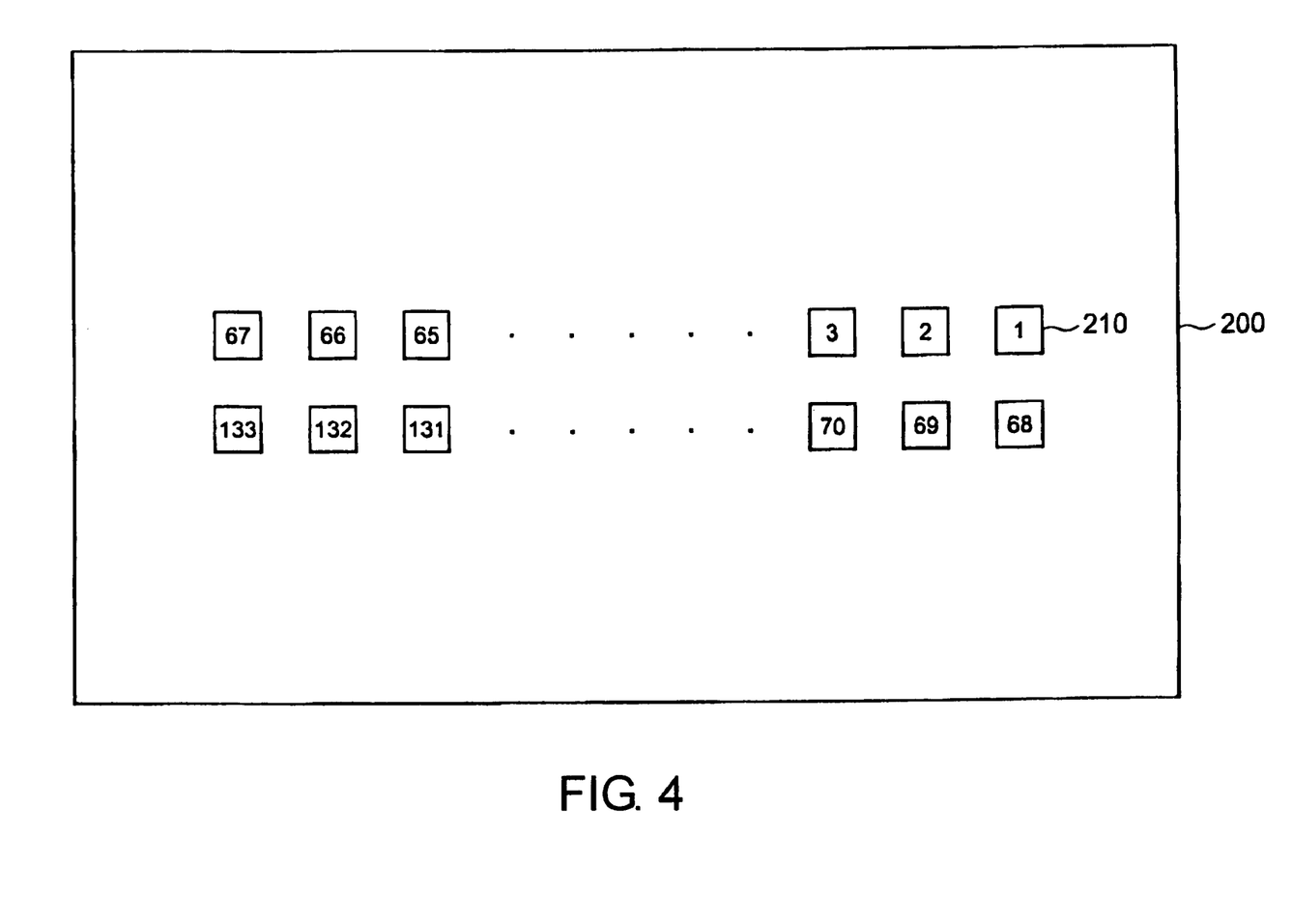
FIG. 4 is a configuration view showing chip pads in a SDRAM chip of a DDR2 type according to an exemplary embodiment of this invention.

Referring now to FIG. 4, the description will be made about arrangement of chip pads 210 in the SDRAM chip of the DDR2 type depicted at 200.

The chip pads 210 of the SDRAM chip 200 of the DDR2 type shown in FIG. 4 are aligned in two rows at a substantially central portion of the SDRAM chip 200 of the DDR2 type. Inasmuch as alignment of the two rows can decease an area of the chip in comparison with alignment of one row, the description will be made about an example in a case where the chip pads 210 are aligned in the two rows in this exemplary embodiment. The SDRAM chip 200 of the DDR2 type comprises one hundred and thirty-three chip pads 210.

The description will be made about assignment of signals for the chip pads 210 in the X8 product, the X16 product, and the X32 product in the SDRAM chip 200 of the DDR2 type.

Figure 5:
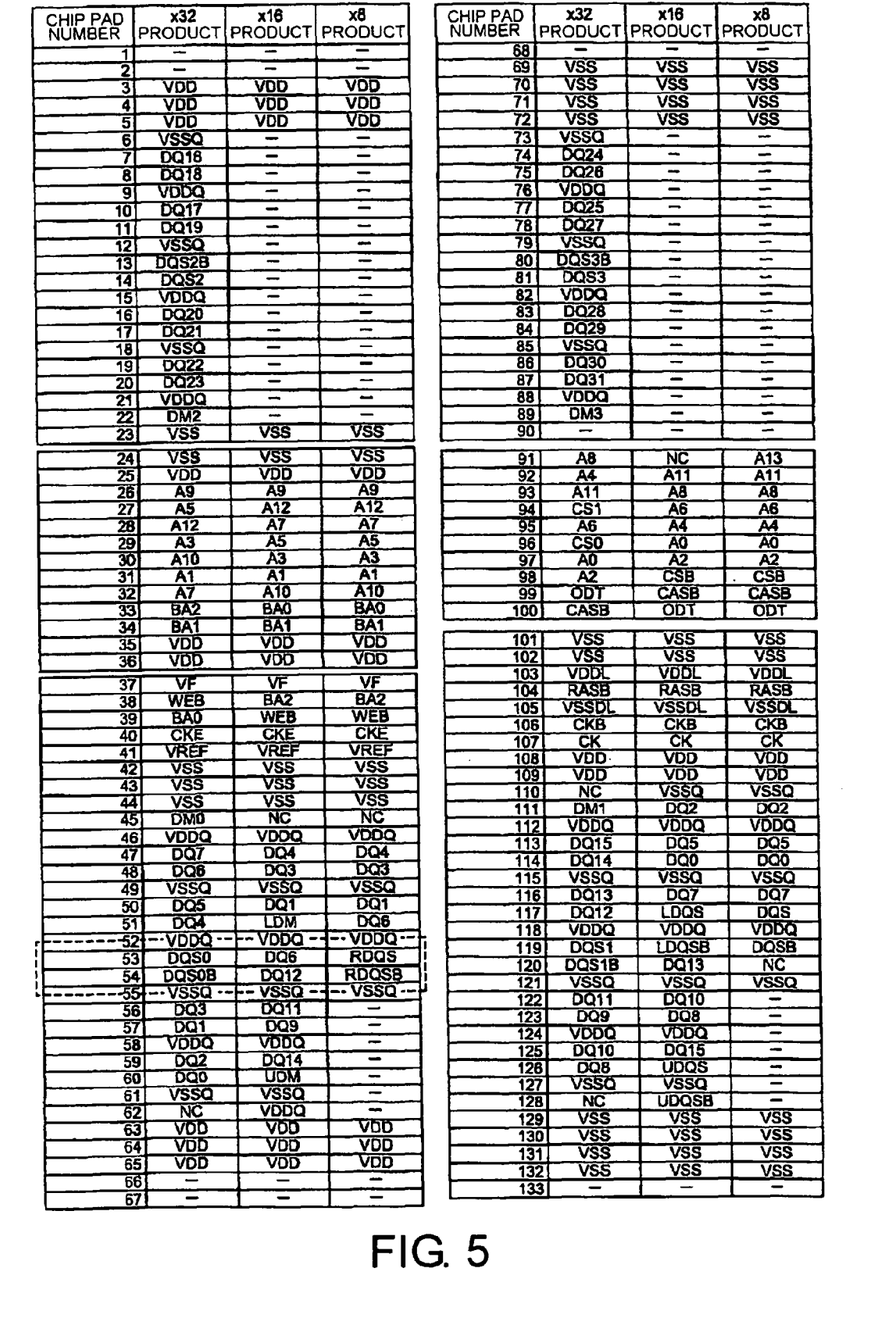
FIG. 5 is a view showing assignment of signals to chip pads of the X8 product, the X16 product, and the X32 product in the SDRAM chip of the DDR2 type according to an exemplary embodiment of this invention.

Referring to FIG. 5, although the number of the chip pads 210 is equal to one hundred and thirty-three, the number of the pins 110 is equal to one hundred and twenty-eight in the X32 product which is the most bit configuration product. The number of the chip pads 210 is more than the number of the pins 110. This is because the SDRAM chip 200 of the DDR2 type requires chip pads 210 for test operation that are not connected to the pins 110 of the package substrate 100. In FIG. 5, each minus sign represents disuse or test and each sign of NC represents disuse.

Now, the description will be concretely made about the chip pads 210 mounted on the package substrate 100.

Figure 6:
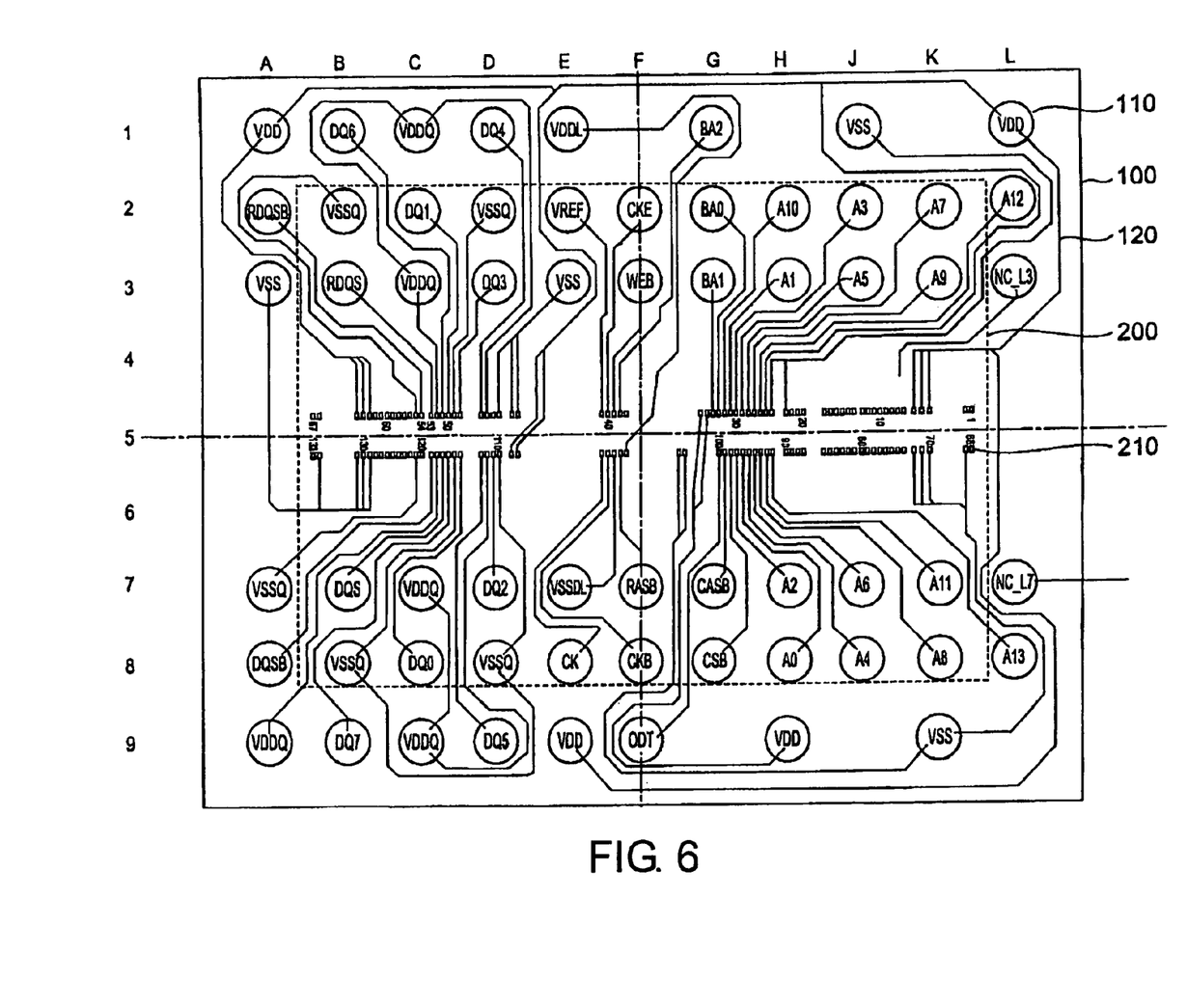
FIG. 6 is a wiring diagram between pins of the X8 product and chip pads in the SDRAM chip of the DDR2 type according to an exemplary embodiment of this invention.

FIG. 6 is a wiring diagram between the pins 110 of the X8 product and the chip pads 210 in the SDRAM chip 200 of the DDR2 type. The package substrate 100 of the X8 product has a main surface (a rear surface of this paper) on which the SDRAM chip 200 of the DDR2 type is mounted. A chip pad array consisting of the predetermined number of the chip pads 210 of the SDRAM chip 200 of the DDR2 type is arranged to an opening portion (not shown) of the package substrate 100 of the X8 product toward a rear surface (a main surface of this paper) of the package substrate 100 of the X8 product. Though the opening portion, the pins 110 of the package substrate 100 of the X8 product are connected to the chip pads 210 of the SDARM chip 200 of the DDR2 type. The opening portion is formed by cutting off a part of an area indicated by numerals 4-6 in the package substrate 100 of the X8 product.

Next, the description will be made about a method of connecting the pins 110 of the package substrate 100 of the X8 product with the chip pads 210 of the SDRAM chip 200 of the DDR2 type in detail. As shown in FIG. 6, the rear surface of the package substrate 100 comprises the pins 110 serving as connecting terminals for the external, a bonding finger (not shown), and wires 120. The bonding finger is disposed between the chip pads 210 and the pins 110. The pins 110 and the bonding finger are connected by the wires 120. Further-more, the bonding finger and the chip pads 210 of the SDRAM chip 200 of the DDR2 type are connected by the wires 120. After the pins 110 of the package substrate 100 of the X8 product and the chip pads 210 of the SDRAM chip 200 of the DDR2 type are connected to one another, the opening portion including the wires 120 is sealed by resin or like and thereby a semiconductor device is formed.

In the package substrate 100 of the X8 product shown in FIG. 6, the pin 110 of the read data strobe signal RDQS at the segment area (3, B) is connected to the chip pad 210 having a number of 53 and the pin 110 of the inverted read data strobe signal RDQSB at the segment area (2, A) is connected to the chip pad 210 having a number of 54.

Figure 7:
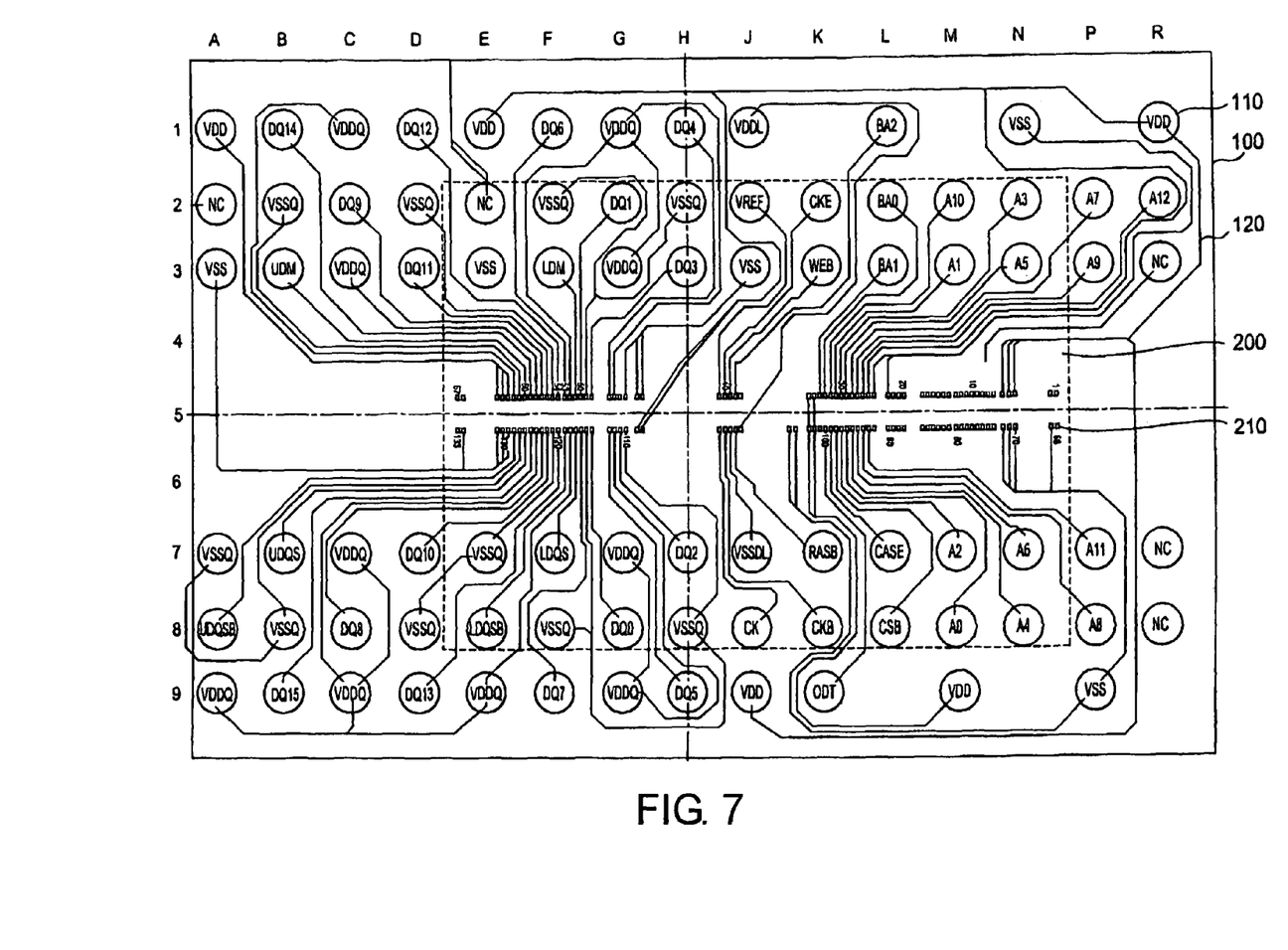
FIG. 7 is a wiring diagram between pins of the X16 product and chip pads in the SDRAM chip of the DDR2 type according to an exemplary embodiment of this invention.

FIG. 7 is a wiring diagram between the pins 110 of the X16 product and the chip pads 210 in the SDRAM chip 200 of the DDR2 type. As shown in FIG. 7, the pin 110 of the data signal DQ6 at the segment area (F, 1) is connected to the chip pad 210 having the number of 53 while the pin 110 of the data signal DQ12 at the segment are (D, 1) is connected to the chip pad 210 having the number of 54.

Figure 8:
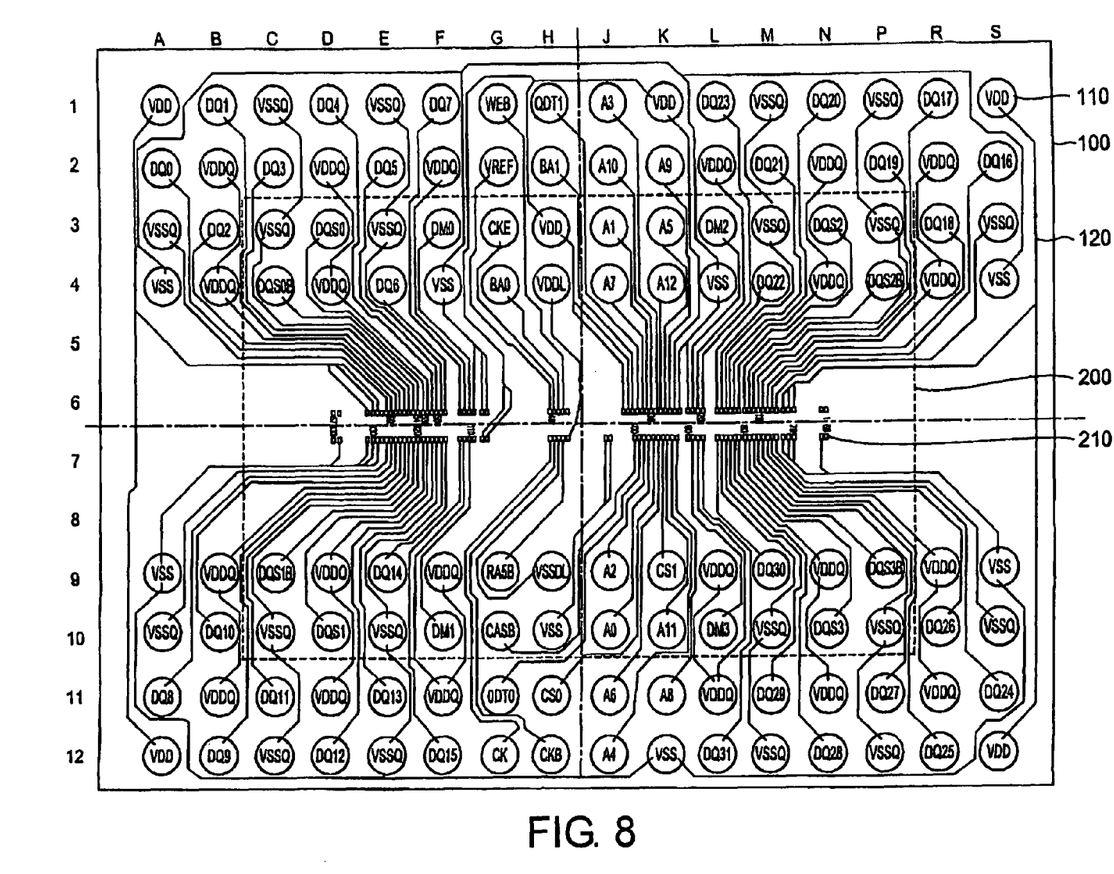
FIG. 8 is a wiring diagram between pins of the X32 product and chip pads in the SDRAM chip of the DDR2 type according to an exemplary embodiment of this invention.

FIG. 8 is a wiring diagram between the pins 110 of the X32 product and the chip pads 210 in the SDRAM chip 200 of the DDR2 type. As shown in FIG. 8, the pin 110 of the data strobe signal DQS0 at the segment area (D, 3) is connected to the chip pad 210 having the number of 53 while the pin 110 of the inverted data strobe signal DQS0B at the segment are (C, 4) is connected to the chip pad 210 having the number of 54.

In the manner which is described above, in the exemplary embodiment of this invention, the signals assigned to the chip pads 210 indicated by the numbers of 53 and 54 are different in the X8 product, the X16 product, and the X32 product in the SDRAM chip 200 of the DDR2 type. However, the semiconductor device according to the exemplary embodiment of this invention comprises switching circuits for switching the signals according to the X8 product, the X16 product, and the X32 product with respect to specific pads 210 (herein, of the numbers of 53 and 54).

Turning back to FIG. 5, as can be understood from an area enclosed with a dotted line, the chip pad 210 having the number of 53 is assigned to the read data strobe signal RDQS in a case of the X8 product, assigned to the data signal DQ6 in a case of the X16 product, and assigned to the data strobe signal DQS0 in a case of the X32 product. Likewise, the chip pad 210 having the number of 54 is assigned to the inverted read data strobe signal RDQSB in a case of the X8 product, assigned to the data signal DQ12 in a case of the X16 product, and assigned to the inverted data strobe signal DQS0B in a case of the X32 product. That is, the exemplary embodiment of this invention is characterized by switching assignment of the signals for the chip pads 210 having the number of 53 and/or 54. In the manner which will later be described, the SDRAM chip 200 of the DDR2 type according to the exemplary embodiment of this invention is characterized by comprising the selection circuits for switching signal circuits connected to the chip pads 210.

It is therefore possible to prevent the chip size from increasing caused by increasing the chip pads 210 on configuring the X8 product, the X16 product, and the X32 product with the same chip. This is because it is unnecessary to separately provide exclusive chip pads 210 for the read data strobe signal RDQS and the inverted read data strobe signal RDQSB which are only included in the X8 product but which are not included in the X16 product and the X32 product.

When assignment of the signals of the chip pads 210 is defined as shown in FIG. 5, it is possible to provide, as the chip pads 210 in which switching is required other than the above-mentioned chip pads 210, for example, the chip pads 210 having numbers of 38, 39, 51, 60, 94, 96, 98-100, 111, 117, 119, 120, and 126. For instance, with respect to the chip pad 210 having the number of 120, it is necessary to switching the data signal DQ13 in a case of the X16 product and the inverted data strobe signal DQS1B in a case of the X32 product. Inasmuch as a case of the X8 product is disuse, the chip pad 210 having the number of 120 may be connected to either the data signal DQ13 or the inverted data strobe signal DQS1B or may be opened.

It is unnecessary to switch with respect to the chip pads having other numbers. This is because assignment is made so as to become the signals having a similar function among different bit configuration products. For instance, it is unnecessary to switch the chip pad 210 having a number of 92. This is because the chip pad 210 having the number of 92 is assigned to an address signal A11 in a case of the X8 product, assigned to the address signal A11 in a case of the X16 product, and assigned to an address signal A4 in a case of the X32 product.

By assigning the chip pads 210 with signal circuits having similar functions among the X8 product, the X16 product, and the X32 product in the manner which is described above, it becomes few the number of the selection circuits for selecting signal circuits having different functions. It is therefore possible to omit redundant chip pads 210, the selection circuits, and signal circuits.

Figure 9:
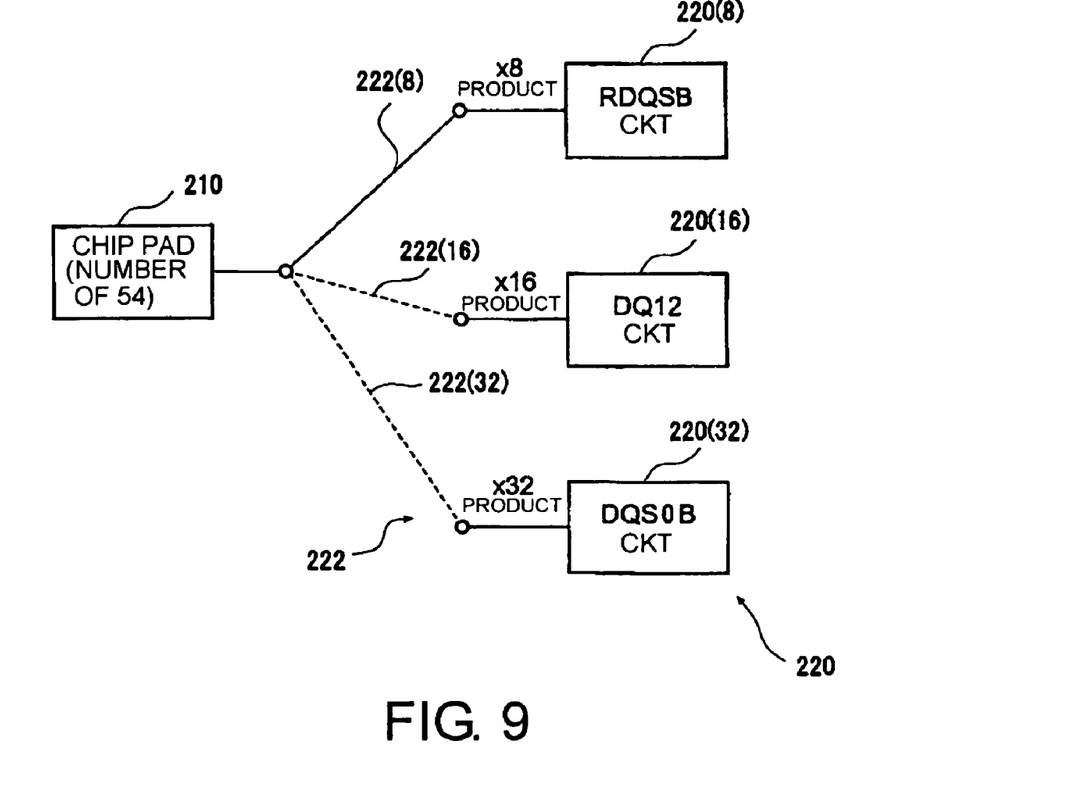
FIG. 9 is a view showing a selection circuit according to a first example of this invention that switches signal circuits to be connected to a chip pad in accordance with a data width of the SDRAM chip of the DDR2 type according to an exemplary embodiment of this invention.
Figure 10:
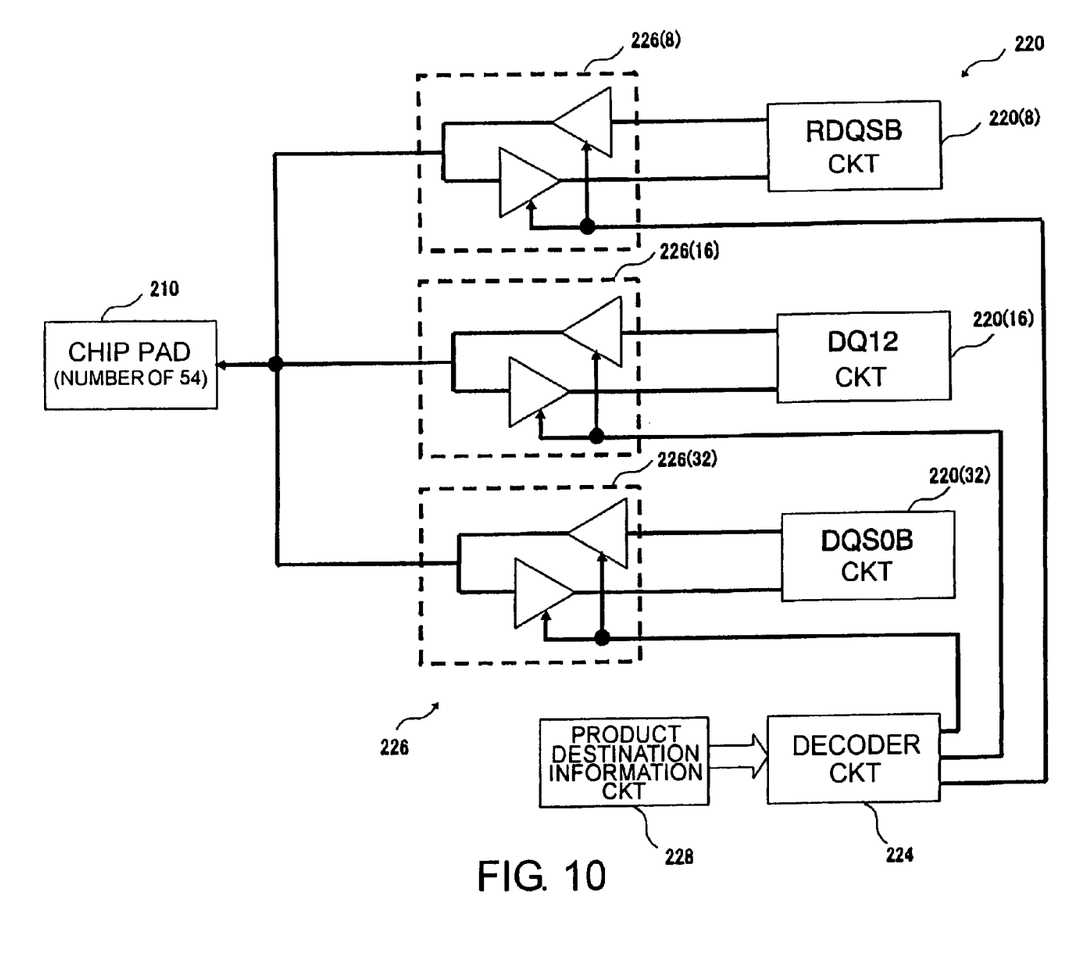
FIG. 10 is a view showing a selection circuit according to a second example of this invention that switches signal circuits to be connected to a chip pad in accordance with a data width of the SDRAM chip of the DDR2 type according to an exemplary embodiment of this invention.

FIGS. 9 and 10 show first and second examples of the selection circuit for selecting signal circuits 220 to be connected to the chip pad 210 in accordance with the bit configuration product, respectively.

Referring to FIG. 9, the first example is shown using, as the selection circuit, a fuse circuit 222 comprising first through third fuses 222(8), 222(16), and 222(32). In the first example shown in FIG. 9, first through third circuits 220(8), 220(16), and 220(32) for the X8 product, the X16 product, and the X32 product are provided with the chip pad 210 having the number of 54 through the first through the third fuses 222(8), 222(16), and 222(32), respectively.

By selectively disconnecting the first through the third fuses 222(8), 222(16), and 222(32) being illustrated, a connection between the chip pad 210 having the number of 54 and the first through the third circuits 220(8), 220(16), and 220(32) is selected. In FIG. 9, a solid line indicates a connected state while a dotted line indicates an open state. In a case of this first example, both of the second and the third fuses 222(16) and 222(32) for the X16 product and the X32 product are disconnected from the chip pad 210 having the number of 54 while the first fuse 222(8) for the X8 product is connected to the chip pad 210 having the number of 54. On manufacturing the SDRAM chip 200 of the DDR2 type, the selection circuit illustrated in FIG. 9 is manufactured so that all of the first through the third signal circuits 200(8), 200(16), and 200(32) for the X8 product, the X16 product, and the X32 product are connected to the chip pad 210 having the number of 54. On assembling the SDRAM chip 200 of the DDR2 type with the package substrate 100, the first through the third fuses 222(8), 222(16), and 222(32) are selectively disconnected in accordance with the bit configuration product in the manner which is described above.

In a case of carrying out selecting by bonding, a bonding circuit comprising first through third anti-fuses may be used as the selection circuit in lieu of the fuse circuit 222. In this event, on manufacturing the SDRAM chip 200 of the DDR2 type, the first through the third circuits 220(8), 220(16), and 220(32) for the X8 product, the X16 product, and the X32 product are opened from the chip pad 210 having the number of 54 through the first through third anti-fuses. One of the first through the third anti-fuses is short-circuited at an assembling process. It is therefore possible to connect, to the chip pad 210 having the number of 54, any one of the first through the third circuits 220(8), 220(16), and 220(32) in accordance with the bit configuration product.

Referring to FIG. 10, a circuit obtained by combining a decoder circuit 224 with first through third tri-state buffers 226(8), 226(16), and 226(32) controlled by the decoder circuit 224 is used as the selection circuit. In the second example illustrated in FIG. 10, the first through the third circuits 220 (8), 220(16), and 220(32) for the X8 product, the X16 product, and the X32 product are provided to the chip pad 210 having the number of 54 through the first through the third tri-state buffers 226(8), 226(16), and 226(32), respectively. Each tri-state buffer 226 comprises two tri-state buffers (which will be described as "sub tri-state buffers") which are faced in the opposite direction in a direction flowing between the chip pad having the number of 54 and each signal circuit 220. The illustrated decoder circuit 224 is supplied with 2-bit product designation information in accordance with the bit configuration product among the X8 product, the X16 product, and the X32 product from a product designation information circuit 228 which comprises a bonding circuit, a fuse circuit, or other circuits. This second example also shows a case of selecting the signal circuits 220 provided to the chip pad 210 having the number of 54 by the selection circuit.

Supplied with the 2-bit product designation information from the product designation information circuit 228, the illustrated decoder circuit 224 supplies a 1-bit control signal to the first through the third tri-state buffers 226(8), 226(16), and 226(32) in accordance with the product designation information.

It will be assumed that the control signal takes a logic "1" level. In this event, each of the tri-state buffers 226 can flow a signal bidirectionally between the chip pad 210 having the number 54 and the signal circuit 220 corresponding to the tri-state buffer 226 in question because the signal can flow from an input to an output in the two sub tri-state buffers. Each state of the tri-state buffers 226 is called a high/low state. It will be assumed that the control signal takes a logic "0" level. In this event, each of the tri-state buffers 226 becomes a high impedance state and therefore the chip pad 210 having the number of 54 and the signal circuit 220 corresponding thereto are insulated.

With this structure, when the product designation information is supplied from the product designation information circuit 228 to the decoder circuit 224, the decoder 224 delivers, in accordance with the product designation information, the control signal of the logic "1" level to a single tri-state buffer (e.g. 226(8)) and delivers the control signal of the logic "0" level to remaining two tri-state, buffers (226(16), 226 (32)). As a result, supplied with the control signal of the logic "1" level, the first tri-state buffer 226(8) alone is put into the high/low state to flow the signal from the input to the output and it is possible to flow the signal bidirectionally between the chip pad 210 having the number of 54 and the first circuit 220(8). Supplied with the control signal of the logic "0" level, the second and the third tri-state buffers 228(16) and 228(32) are put into the high impedance state and the chip pad 210 having the number of 54 is isolated from the second and the third circuits 220(16) and 220(32). In the manner which is described above, similar to a case of FIG. 9, with this structure, it is possible to connect, to the chip pad 210 having the number of 54, any one of the first through the third circuits 220(8), 220(16), and 220(32) in accordance with the bit configuration product.

In each of the first through the third tri-state buffers 226(8), 226(16), and 226(32), it is possible to omit one sub tri-state buffer in a case where a signal flows unidirectionally between the chip pad 210 having the number of 54 and the signal circuit 220 corresponding thereto.

Turning back to FIGS. 2 and 3, in the X16 product, the two pairs of data strobe signals (LDQS, LDQSB) and (UDQS, UDQSB) are disposed in the lower left block. On the other hand, in the X32 product, the first through the fourth pairs of data strobe signals (DQS0, DQS0B), (DQS1, DQS1B), (DQS2, DQS2B), and (DQS3, DQS3B) are disposed in the upper left block, the lower left block, the upper right block, and the lower right block, respectively. Accordingly, it is difficult to run the wires 120 in order to realize the X32 product and the X16 product with the one chip and the problem arises because the exclusive chip pads 210 are required.

According to the second example, as shown in FIG. 5, the semiconductor device comprises the chip pads (e.g. having the numbers of 117, 126, 128, or the like) which are shared in at least two of the X8 product, the X16 product, and the X32 product, the signal circuits 220 disposed close by the chip pads 210 in accordance with the bit configuration product, and the selection circuits disposed between the chip pads 210 and the signal circuits 220. With this structure, it is possible to obtain an effect similar to that of the above-mentioned first example by selectively connecting the signal circuits 220 in accordance with the bit configuration product to the chip pads 210 by the selection circuits.

While the invention has been particularly shown and described with reference to exemplary embodiments thereof, the invention is not limited to these embodiments. It will be understood by those of ordinary skilled in the art that various changes in form and details may be made therein without departing from the sprit and scope of the present invention as defined by the claims.

What is claimed is:

1. A device comprising:
a semiconductor memory chip configured to perform data read and write operations in one of 8-bit, 16-bit and 32-bit units; and
a package substrate on which the semiconductor memory chip is mounted, the package substrate including a plurality of pins;
the semiconductor memory chip comprising:
at least two rows of chip pads, each of the rows including a plurality of chip pads electrically connected to the pins of the package substrate, respectively,
a first circuit producing a read data strobe signal,
a second circuit producing a data signal, and
a selection circuit provided among one of the chip pads, the first circuit and the second circuit, the selection circuit electrically connecting the one of the chip pads to the first circuit when the semiconductor memory chip is configured to perform the data read and write operations in 8-bit unit and to the second circuit when the semiconductor memory chip is configured to perform the data read and write operations in 16-bit unit.

2. The device as claimed in claim 1, wherein said semiconductor memory chip is of a SDRAM chip of a DDR2 type.

3. The device as claimed in claim 1, wherein said semiconductor memory chip further comprises a third circuit producing a data strobe signal, and the selection circuit electrically connects the one of the chip pads to the third circuit when the semiconductor memory chip is configured to perform the data read and write operations in 32-bit unit.

4. The device as claimed in claim 3, wherein said semiconductor memory chip is of a SDRAM chip of a DDR2 type.

5. The device as claimed in claim 3, wherein the selection circuit comprises a fuse circuit comprising first through third fuses, the first fuse being disposed between one of the chip pads and the first circuit, the second fuse being disposed between one of the chip pads and the second circuit, the third fuse being disposed between one of the chip pads and the third circuit.

6. The device as claimed in claim 3, wherein the selection circuit comprises a bonding circuit comprising first through third anti-fuses, the first anti-fuse being disposed between one of the chip pads and the first circuit, the second anti-fuse being disposed between one of the chip pads and the second circuit, the third anti-fuse being disposed between one of the chip pad and the third circuit.

7. The device as claimed in claim 3, wherein the selection circuit comprises:
 a decoder circuit; and
 first through third tri-state buffers which are controlled by the decoder circuit, the first tri-state buffer being disposed between one of the chip pads and the first circuit, the second tri-state buffer being disposed between one of the chip pads and the second circuit, the third tri-state buffer being disposed between one of the chip pads and the third circuit.

8. The device as claimed in claim 7, wherein each of the first through the third tri-state buffer comprises two sub tri-state buffers which are faced in the opposite direction each other.

9. The device as claimed in claim 7, wherein the decoder circuit delivers a control signal of a logic "1" level to one of the first through the third tri-state buffers and delivers a control signal of a logic "0" level to remaining two of the first through the third tri-state buffers,
 wherein said one of the first through the third tri-state buffers is put into a high/low state, said remaining two of the first through the third tri-state buffers being put into a high impedance state.

10. A device comprising a SDRAM chip of a DDR2 type, the SDRAM chip comprising:
 a plurality of chip pads; and
 a control circuit assigning one of the chip pads to a first signal when the SDRAM chip performs data read and write operations in 8-bit unit, to a second signal different from the first signal when the SDRAM chip performs data read and write operations in 16-bit unit and to a third signal different from each of the first and the second signals when the SDRAM chip performs data read and write operations in 32-bit unit.

11. The device as claimed in claim 10,
 wherein the first signal is used as a read data strobe signal and the second signal is used as a data signal.

12. The device as claimed in claim 11, wherein the third signal is used as a data strobe signal.

13. The device as claimed in claim 10, wherein the SDRAM chip further comprises a first circuit producing the first signal, a second circuit producing the second signal and a third circuit producing the third signal, and the control circuit includes a selection circuit selecting one of the first, second and third circuits to electrically connect the one of the first, second and third circuits to the one of the chip pads.

14. The device as claimed in claim 13, wherein the first circuit produces a read data strobe signal as the first signal, the second circuit produces a data signal as the second signal, and the third circuit produces a data strobe signal as the third signal.

15. The device as claimed in claim 14, wherein the read data strobe signal is used when the SDRAM chip performs a data read operation of the data read and write operations to output data from an inside of the device to an outside of the device, the data signal is used as one bit of sixteen bits of data which are read from or written into the SDRAM chip, and the data strobe signal is used when the SDRAM chip performs either a data read operation or a data write operation of the data read and write operations.

16. A device comprising:
 a SDRAM chip of a DDR2 type which may be configured to perform data read and write operations in one of the 8-bit, 16-bit and 32-bit units; and
 a package substrate including a plurality of electrode pins, the SDRAM chip being mounted on the package substrate;
 the SDRAM chip comprising:
 a plurality of electrode pads each electrically connected to an associated one of the electrode pins of the package substrate;
 a first circuit producing a read data strobe signal when the SDRAM chip is configured to perform the data read and write operations in 8-bit unit;
 a second circuit producing a data signal when the SDRAM chip is configured to perform the data read and write operations in 16-bit unit;
 a third circuit producing a data strobe signal when the SDRAM chip is configured to perform the data read and write operations in 32-bit unit; and
 a control circuit forming a first electrical path between one of the electrode pads and the first circuit when the SDRAM chip is configured to perform the data read and write operations in 8-bit unit, a second electrical path between the one of the electrode pads and the second circuit when the SDRAM chip is configured to perform the data read and write operations in 16-bit unit, and a third electrical path between the one of the electrode pads and the third circuit when the SDRAM chip is configured to perform the data read and write operations in 32-bit unit.

17. The device as claimed in claim 16, wherein the read date strobe signal is used when the SDRAM chip performs a data read operation on the data read and write operations to output data from an inside of the device to an outside of the device, the data signal is used as one bit of sixteen bits of data which are read from or written into the SDRAM chip, and the data strobe signal is used when the SDRAM chip performs either a data read operation or a date write operation of the data read and write operations.

* * * * *